(12) United States Patent
Zhu (10) Patent No.: US 11,764,310 B2
(45) Date of Patent: Sep. 19, 2023

(54) VERTICAL STORAGE DEVICE, METHOD OF MANUFACTURING THE SAME, AND ELECTRONIC APPARATUS INCLUDING STORAGE DEVICE

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 17/687,869

(22) Filed: Mar. 7, 2022

(65) Prior Publication Data

US 2022/0285559 A1 Sep. 8, 2022

(30) Foreign Application Priority Data

Mar. 8, 2021 (CN) .......................... 202110252928.9

(51) Int. Cl.
| | |
|---|---|
| *H01L 29/788* | (2006.01) |
| *H01L 29/792* | (2006.01) |
| *H01L 21/28* | (2006.01) |
| *H01L 29/78* | (2006.01) |
| *H01L 21/02* | (2006.01) |
| *H01L 21/225* | (2006.01) |
| *H01L 21/3065* | (2006.01) |
| *H01L 29/08* | (2006.01) |

(Continued)

(52) U.S. Cl.
CPC .... *H01L 29/7889* (2013.01); *H01L 21/02636* (2013.01); *H01L 21/2252* (2013.01); *H01L 21/3065* (2013.01); *H01L 29/0847* (2013.01); *H01L 29/1054* (2013.01); *H01L 29/6684* (2013.01); *H01L 29/66825* (2013.01); *H01L 29/66833* (2013.01); *H01L 29/78391* (2014.09); *H01L 29/7926* (2013.01)

(58) Field of Classification Search
CPC .......... H01L 29/7889; H01L 21/02636; H01L 21/2252; H01L 21/3065; H01L 29/0847; H01L 29/1054; H01L 29/66825; H01L 29/66833; H01L 29/6684; H01L 29/78391; H01L 29/7926; H01L 29/40114; H01L 29/40111; H01L 29/40117; H10B 41/30; H10B 43/30; H10B 51/30

See application file for complete search history.

(56) References Cited

U.S. PATENT DOCUMENTS

2020/0083329 A1* 3/2020 Cho .................... H01L 29/7827

* cited by examiner

*Primary Examiner* — David Vu
(74) *Attorney, Agent, or Firm* — Christopher R. Christenson; Kelly, Holt & Christenson, P.L.L.C.

(57) ABSTRACT

A vertical storage device, a method of manufacturing the same, and an electronic apparatus including the storage device are provided. The storage device includes: a first source/drain layer located at a first height with respect to a substrate and a second source/drain layer located at a second height different from the first height; a channel layer connecting the first source/drain layer and the second source/drain layer; and a gate stack including a storage function layer, the storage function layer extending on a sidewall of the channel layer and extending in-plane from the sidewall of the channel layer onto a sidewall of the first source/drain layer and a sidewall of the second source/drain layer.

37 Claims, 9 Drawing Sheets

(51) Int. Cl.
*H01L 29/10* (2006.01)
*H01L 29/66* (2006.01)

VERTICAL STORAGE DEVICE, METHOD OF MANUFACTURING THE SAME, AND ELECTRONIC APPARATUS INCLUDING STORAGE DEVICE

CROSS REFERENCE TO RELATED APPLICATION(S)

This application claims priority to Chinese Patent Application No. 202110252928.9, filed on Mar. 8, 2021, the entire contents of which are incorporated herein in their entireties by reference.

TECHNICAL FIELD

The present disclosure relates to a field of semiconductors, in particular to a vertical storage device, a method of manufacturing the same, and an electronic apparatus including such a storage device.

BACKGROUND

In a horizontal device such as a Metal Oxide Semiconductor Field Effect Transistor (MOSFET), a source electrode, a gate electrode, and a drain electrode are arranged in a direction substantially parallel to a substrate surface. Due to such an arrangement, it is difficult to further downsize the horizontal device. In contrast, in a vertical device, a source electrode, a gate electrode, and a drain electrode are arranged in a direction substantially perpendicular to a substrate surface. Therefore, compared to the horizontal device, it is easier to downsize the vertical device.

However, for the vertical device such as a vertical nanowire or nanosheet MOSFET, it is difficult to control a diameter of the nanowire or a thickness of the nanosheet. Therefore, it is difficult to control a channel dimension or a gate length.

SUMMARY

According to an aspect of the present disclosure, a vertical storage device is provided, including: a first source/drain layer located at a first height with respect to a substrate and a second source/drain layer located at a second height different from the first height; a channel layer connecting the first source/drain layer and the second source/drain layer; and a gate stack including a storage function layer, the storage function layer extending on a sidewall of the channel layer and extending in-plane from the sidewall of the channel layer onto a sidewall of the first source/drain layer and a sidewall of the second source/drain layer.

According to another aspect of the present disclosure, a method of manufacturing a vertical storage device is provided, including: providing a stack layer of a first source/drain layer, a semiconductor layer and a second source/drain layer on a substrate; forming an isolation layer surrounding a sidewall of the stack layer; forming a space for a gate stack in the isolation layer, wherein a portion of a sidewall of the stack layer in a circumferential direction is exposed in the space, and a remaining portion of the sidewall of the stack layer in the circumferential direction is covered by the isolation layer; and forming a gate stack including a storage function layer in the space, wherein the gate stack extends on the portion of the sidewall of the stack layer.

According to another aspect of the present disclosure, an electronic apparatus including the vertical storage device described above is provided.

BRIEF DESCRIPTION OF THE DRAWINGS

The above and other objectives, features and advantages of the present disclosure will be more apparent through the following description of embodiments of the present disclosure with reference to the accompanying drawings, in which:

FIG. 1(a) to FIG. 6 show schematic diagrams of some stages in a process of manufacturing a storage device according to an embodiment of the present disclosure;

FIG. 7(a) to FIG. 8 show schematic diagrams of some stages in a process of manufacturing a storage device according to another embodiment of the present disclosure;

FIG. 10 to FIG. 12 show schematic diagrams of some stages in a process of manufacturing a storage device according to another embodiment of the present disclosure, in which:

FIG. 1(a), FIG. 2(a), FIG. 3(a), FIG. 4(a), and FIG. 7(a) show top views, and a position of line AN is shown in FIG. 1(a); and FIG. 1(b), FIG. 2(b), FIG. 3(b), FIG. 4(b), FIG. 5, FIG. 6, FIG. 7(b), and FIG. 8 to FIG. 12 show cross-sectional views taken along line AA'.

Throughout the accompanying drawings, the same or similar reference numerals indicate the same or similar components.

DETAILED DESCRIPTION OF EMBODIMENTS

Embodiments of the present disclosure will be described below with reference to the accompanying drawings. It should be understood, however, that these descriptions are merely exemplary and are not intended to limit the scope of the present disclosure. In addition, in the following description, descriptions of well-known structures and technologies are omitted to avoid unnecessarily obscuring the concepts of the present disclosure.

Various schematic structural diagrams according to the embodiments of the present disclosure are shown in the accompanying drawings. The figures are not drawn to scale. Some details are enlarged and some details may be omitted for clarity of presentation. The shapes of various regions and layers as well as the relative size and positional relationship thereof shown in the figures are only exemplary. In practice, there may be deviations due to manufacturing tolerances or technical limitations, and those skilled in the art may additionally design regions/layers with different shapes, sizes, and relative positions according to the actual needs.

In the context of the present disclosure, when a layer/element is referred to as being "on" another layer/element, the layer/element may be directly on the another layer/element, or there may be an intermediate layer/element between them. In addition, if a layer/element is located "on" another layer/element in one orientation, the layer/element may be located "under" the another layer/element when the orientation is reversed.

A storage device according to the embodiments of the present disclosure is based on a vertical device. The storage device may be a flash device of, for example, a floating gate type, a charge trap type, or a ferroelectric type. The vertical device may include an active region arranged on a substrate in a vertical direction (a direction substantially perpendicular to a substrate surface), and the active region may include source/drain regions arranged at upper and lower ends and a channel region located between the source/drain regions. A conductive path may be formed between the source/drain regions through the channel region. In the active region, the source/drain regions and the channel region may be defined, for example, by a doping concentration. The source/drain regions may be formed in a first source/drain layer and a second source/drain layer at different heights with respect to the substrate, respectively, and the channel region may be formed in a channel layer connecting the first source/drain layer and the second source/drain layer.

The channel layer may be arranged between the first source/drain layer and the second source/drain layer in the vertical direction, so that the first source/drain layer, the channel layer, and the second source/drain layer may be stacked on each other to form a stack layer. For example, the first source/drain layer, the channel layer, and the second source/drain layer may be sequentially formed by an epitaxial growth. The stack layer may be integrally patterned (to define the active region) so that a sidewall of the first source/drain layer, a sidewall of the channel layer, and a sidewall of the second source/drain layer may be substantially coplanar. A gate stack may extend on a portion of a sidewall of the stack layer in a circumferential direction, and the channel region may be formed on a sidewall of the channel layer facing the gate stack. Then, a channel dimension or a gate length may be defined by a thickness of the channel layer (which may be well controlled by the epitaxial growth). In addition, the stack layer of the first source/drain layer, the channel layer, and the second source/drain layer may form a bulk material, and thus the channel region is formed in the bulk material. In this case, a process may be simple.

Alternatively, the channel layer may be an additional epitaxial layer. The epitaxial layer may extend from the sidewall of the first source/drain layer to the sidewall of the second source/drain layer, so as to connect the first source/drain layer and the second source/drain layer. For example, a stack layer of a first source/drain layer, a semiconductor layer, and a second source/drain layer may be provided on the substrate, and the epitaxial layer may be grown on a portion of the sidewall of the stack layer in the circumferential direction. The stack layer may be integrally patterned so that a sidewall of the first source/drain layer, a sidewall of the semiconductor layer, and a sidewall of the second source/drain layer may be substantially coplanar. The semiconductor layer between the first source/drain layer and the second source/drain layer may be left or removed in a resultant device. A gate stack may extend on the epitaxial layer, and a channel region may be formed on a sidewall of the epitaxial layer facing the gate stack. Then, the channel dimension or the gate length may be defined at least in part by a thickness of the semiconductor layer (which may be well controlled by the epitaxial growth). The epitaxial layer may be thin, and may form a nanosheet or nanowire, and thus the channel region is formed in the nanosheet or nanowire (the storage device becomes a nanosheet or nanowire device). In this case, a short channel effect may be well controlled. In addition, as described below, a Super Steep Retrograde Well (SSRW) may be formed in the epitaxial layer, which may help control the short channel effect.

The gate stack may include a storage function layer, for example, of a floating gate type, a charge trap type or a ferroelectric type. Specifically, the storage function layer may include at least one of a charge trap material, a floating gate, or a ferroelectric material.

The vertical storage device may be manufactured, for example, as follows. For example, the stack layer of the first source/drain layer, the semiconductor layer, and the second source/drain layer may be provided on the substrate. The gate stack may be formed on the sidewall of the stack layer. Taking into account an electrical contact with at least some of the layers in the stack layer, the gate stack may be formed on a portion of the sidewall (e.g., a sidewall on one side) of the stack layer in the circumferential direction, while a remaining position in the circumferential direction (e.g., another side, especially a side opposite to the gate stack) may be left for a contact portion. A definition of a formation space for a gate stack may be combined with a formation of an isolation layer. For example, the isolation layer may be formed on the substrate to surround the sidewall of the stack layer, and a space for the gate stack (e.g., a space on only one side of the stack layer, as described above) may be hollowed in the isolation layer. The space may expose a portion of the sidewall of the stack layer so that the gate stack subsequently formed in the space may directly face the portion of the sidewall. A gate stack with a storage function layer may be formed in the space to achieve the storage device.

The stack layer may be formed by an epitaxial growth. Then, a thickness of each layer in the stack layer, particularly the semiconductor layer, may be well controlled. Each layer in the stack layer may be doped in situ while being grown, so as to achieve a desired doping characteristic. For example, the first source/drain layer and the second source/drain layer may be heavily doped to achieve the source/drain regions, and the semiconductor layer may be lightly doped or not intentionally doped to achieve the channel region.

The semiconductor layer in the stack layer may serve as the channel layer. Alternatively, an epitaxial layer may be additionally grown on the sidewall of the stack layer exposed in the space of the isolation layer, and a channel region may be formed in the epitaxial layer. The channel dimension or the gate length may be determined at least in part by the thickness of the semiconductor layer and thus may be well controlled.

In a case of growing the epitaxial layer, a device characteristic may be improved by selecting a material of the epitaxial layer. In addition, an annealing may be performed so that a dopant in the first source/drain layer, a dopant in the channel layer (if doped), and a dopant in the second source/drain layer may be diffused into portions of the epitaxial layer laterally adjacent thereto, respectively. A process parameter of the annealing may be controlled so that an SSRW may be formed in a portion (corresponding to the channel region) of the epitaxial layer at a height between the first source/drain layer and the second source/drain layer. In addition, the semiconductor layer may be removed after the epitaxial layer is grown.

The present disclosure may be presented in a variety of forms, some examples of which will be described below. In the following description, a selection of various materials is involved. In the selection of materials, in addition to a function of the material (for example, a semiconductor material may be used to form the active region, a dielectric material may be used to form an electrical isolation, and a conductive material may be used to form an electrode, an interconnection structure, etc.), an etching selectivity is also considered. In the following description, a required etching selectivity may or may not be indicated. It should be clear to those skilled in the art that when etching a material layer is mentioned below, if it is not mentioned or shown in figures that other layers are also etched, then the etching may be selective, and the material layer may have an etching selectivity relative to other layers exposed to the same etching formula.

FIG. 1(a) to FIG. 6 show schematic diagrams of some stages in a process of manufacturing a storage device according to the embodiments of the present disclosure.

Figures 1A, 1B:
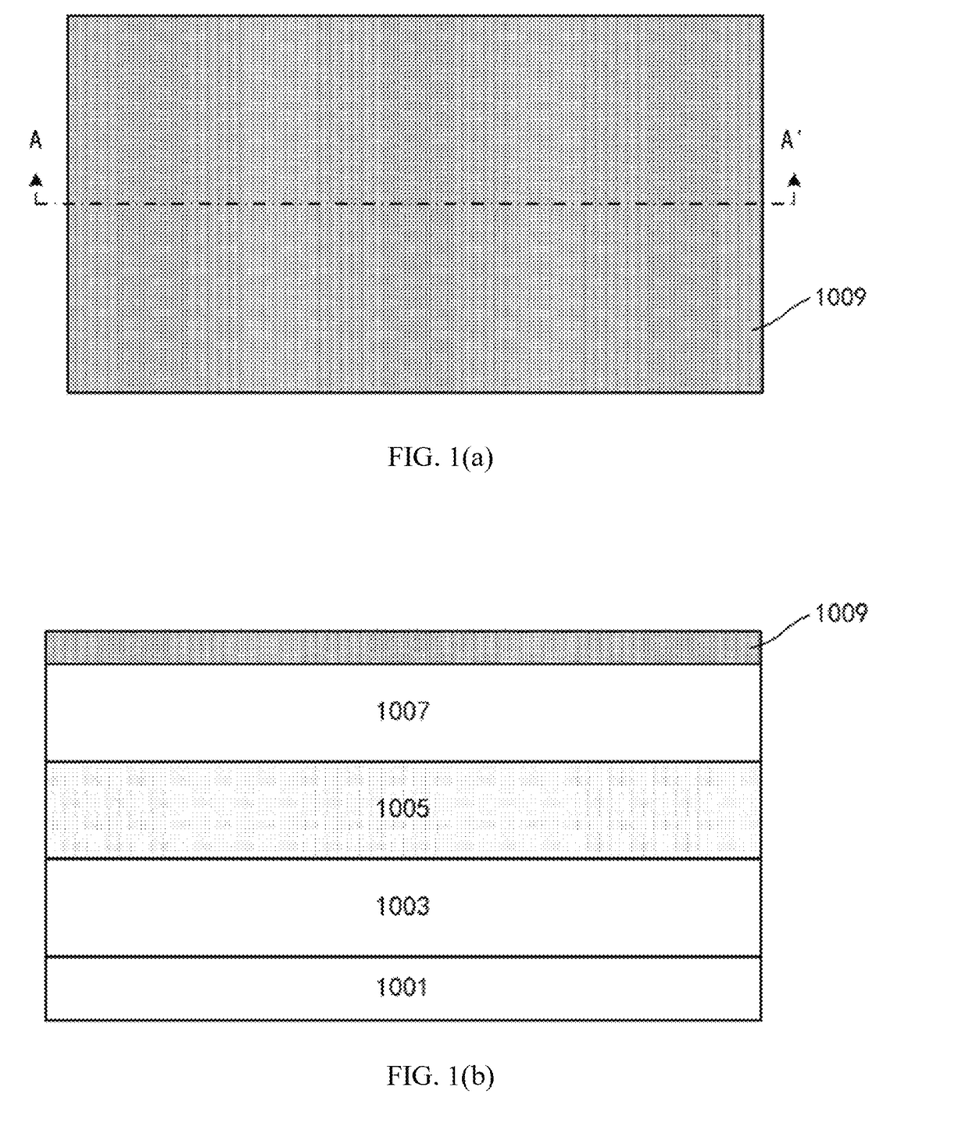

As shown in FIG. 1(a) and FIG. 1(b), a substrate 1001 is provided. The substrate 1001 may be a substrate of various forms, including but not limited to a bulk semiconductor material substrate such as a bulk Si substrate, a semiconductor-on-insulator (SOI) substrate, a compound semiconductor substrate such as a SiGe substrate, and the like. In the following description, for ease of explanation, the bulk Si substrate such as a silicon wafer is illustrated by way of example.

A first source/drain layer 1003, a channel layer 1005, and a second source/drain layer 1007 may be sequentially formed on the substrate 1001 by, for example, an epitaxial growth. The first source/drain layer 1003 and the second source/drain layer 1007 may define a source/drain region. For example, the source/drain region may be formed in the first source/drain layer 1003 and the second source/drain layer 1007 by doping (e.g., doping in situ during growth), and a thickness of the source/drain region may be in a range of, for example, about 20 nm to 50 nm. The channel layer 1005 may define a gate length, and a thickness of the channel layer 1005 may correspond to a desired gate length in a range of, for example, about 15 nm to 100 nm. Each layer grown on the substrate 1001 may be a single crystalline semiconductor layer.

The first source/drain layer 1003, the channel layer 1005, and the second source/drain layer 1007 may include various suitable semiconductor materials, for example, an elemental semiconductor material such as Si or Ge, a compound semiconductor material such as SiGe, and the like. The first source/drain layer 1003 and the second source/drain layer 1007 may include the same semiconductor material, and the channel layer 1005 may include the same or different material as or from that of the first source/drain layer 1003 and the second source/drain layer 1007. In the example, the first source/drain layer 1003, the channel layer 1005, and the second source/drain layer 1007 may include Si. The first source/drain layer 1003, the channel layer 1005, and the second source/drain layer 1007 may form a bulk material stack.

The first source/drain layer 1003 and the second source/drain layer 1007 may be doped in situ while being grown, so as to subsequently form the source/drain region. For example, for an n-type device, an n-type doping may be performed, and for a p-type device, a p-type doping may be performed. A doping concentration may be, for example, in a range of about 1E19 $cm^{-3}$ to 1E21 $cm^{-3}$. In the example, the n-type device is illustrated by way of example. A p-type well (with a doping concentration in a range of, for example, about 1E17 $cm^{-3}$ to 5E18 $cm^{-3}$ and a depth in a range of, for example, about 200 nm to 500 nm) may be formed in the substrate 1001 before the epitaxial growth, so as to facilitate a formation of an n-type device on the substrate.

The channel layer 1005 may be not intentionally doped, or may be lightly doped by doping in situ while being grown, so as to adjust a device threshold voltage ($V_t$). For example, for the n-type device, the p-type doping may be performed with a doping concentration in a range of about 0 to 5E18 $cm^{-3}$.

Since various layers are doped separately, a doping concentration interface may be formed between the layers.

For a purpose of patterning, a hard mask layer 1009 may be formed on the second source/drain layer 1007, for example, by a deposition. Taking into account the etching selectivity in a subsequent process, the hard mask layer 1009 may include a nitride (e.g., silicon nitride), and a thickness of the hard mask layer 1009 may be in a range of, for example, about 50 nm to 200 nm.

Figure 2A:
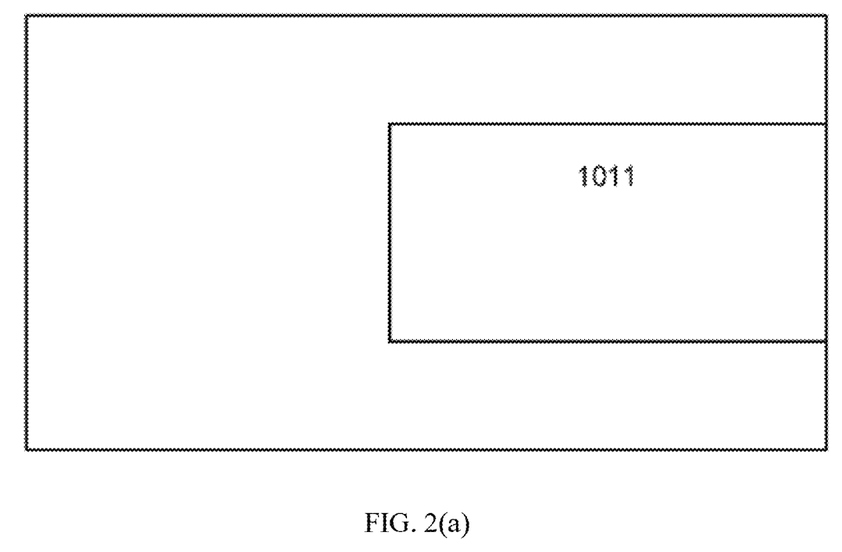
Figure 2B:
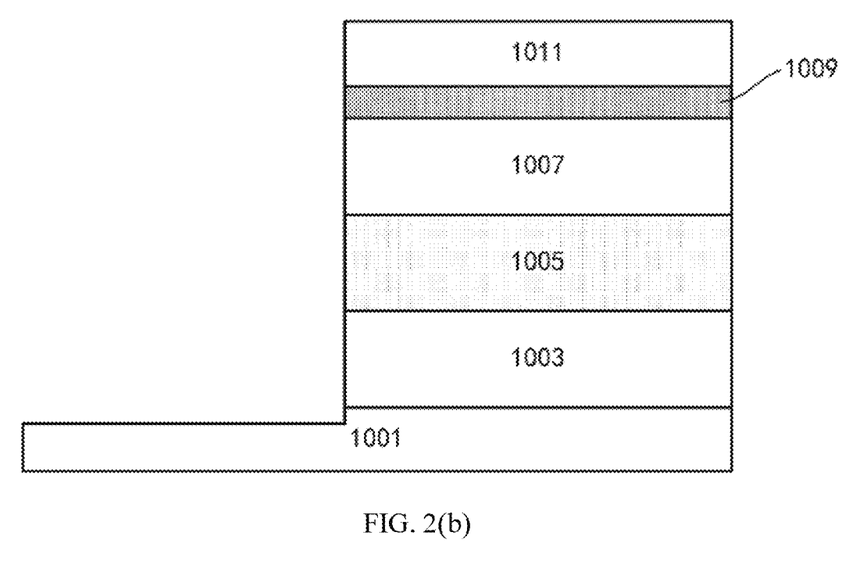

Next, the active region of the device may be defined. For example, as shown in FIG. 2(a) and FIG. 2(b), a photoresist 1011 may be applied on the hard mask layer 1009, the photoresist 1011 may be patterned into a desired shape (which is a substantially rectangular shape in this example) by photolithography (exposure and development), and a selective etching, such as Reactive Ion Etching (RIE), may be performed sequentially on the hard mask layer 1009, the second source/drain layer 1007, the channel layer 1005, and the first source/drain layer 1003, with the patterned photoresist 1011 as a mask. The RIE may be performed into the substrate 1001. After the etching, the first source/drain layer 1003, the channel layer 1005, and the second source/drain layer 1007 may be a column (which has a rectangular section in this example). The RIE may be performed, for example, in a direction substantially perpendicular to the substrate surface, so that the column is also substantially perpendicular to the substrate surface. After that, the photoresist 1011 may be removed.

A vertical sidewall of the first source/drain layer 1003, a vertical sidewall of the channel layer 1005 and a vertical sidewall of the second source/drain layer 1007 may be substantially aligned in the vertical direction, or substantially coplanar.

The shape of the active region is not limited to this, and other shapes may be formed according to a design layout. For example, in a top view, the active region may be circular, elliptical, square, polygonal, and the like.

Figure 3A:
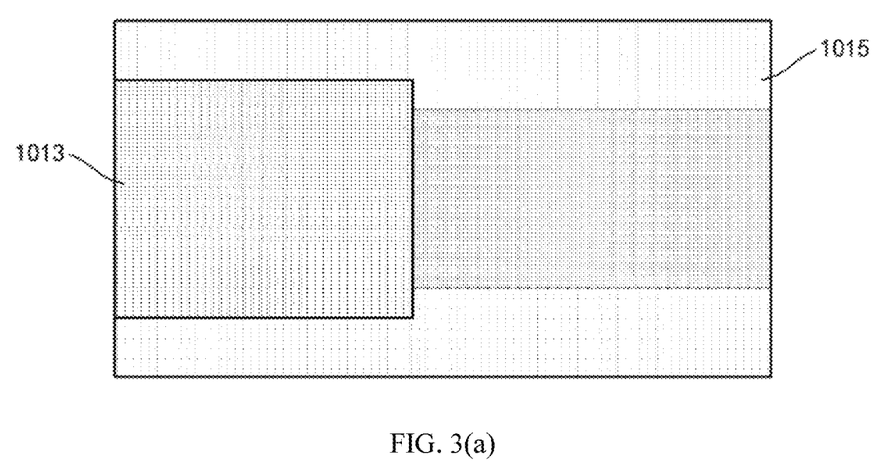
Figure 3B:
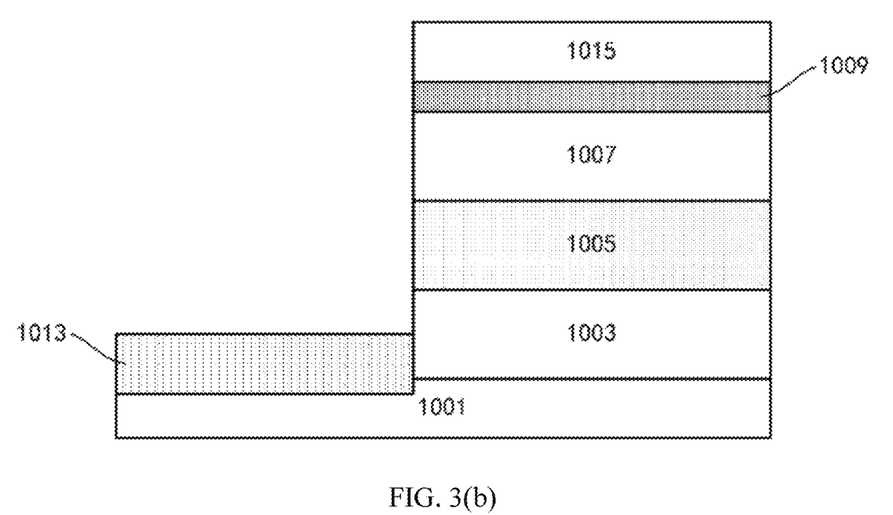

An isolation layer may be formed around the active region to achieve an electrical isolation. For example, as shown in FIG. 3(a) and FIG. 3(b), a dielectric material such as an oxide (e.g., silicon oxide) may be deposited on the substrate 1001, and a planarization process such as Chemical Mechanical Polishing (CMP) may be performed on the deposited dielectric material (CMP may stop at the hard mask layer 1009), so as to form an isolation layer 1013. The isolation layer 1013 may surround a periphery of the active region and cover a sidewall of the active region.

A formation space for a gate stack may be defined in the isolation layer 1013. For example, a photoresist 1015 may be formed on the isolation layer 1013 and the hard mask layer 1009, and the photoresist 1015 may be patterned by photolithography to expose a portion of the isolation layer 1013 adjacent to the active region, and then the exposed portion of the isolation layer 1013 may be etched back by, for example, RIE. After the isolation layer 1013 is etched back, a top surface of the isolation layer 1013 may be lower than a bottom surface of the channel layer 1005 (or a top surface of the first source/drain layer 1003), so that the gate stack subsequently formed on the isolation layer 1013 may overlap the channel layer 1005 in an entire thickness of the channel layer 1005. After that, the photoresist 1015 may be removed.

As shown in FIG. 3(a), in the example, the formation space for the gate stack is located on a side of the active region (left side in FIG. 3(a)), and a side of the formation space facing the active region extends beyond the active region in a lateral direction (a vertical direction in the paper plane of the figure) so that the gate stack subsequently formed in the space may overlap an entire range of the channel layer 1005 in the lateral direction.

Then, the gate stack may be formed in the space described above. In order to form a storage device, a storage function may be achieved by the gate stack. For example, the gate stack may include a storage structure, such as a floating gate, a charge trap layer, or a ferroelectric material, etc.

Figure 4A:
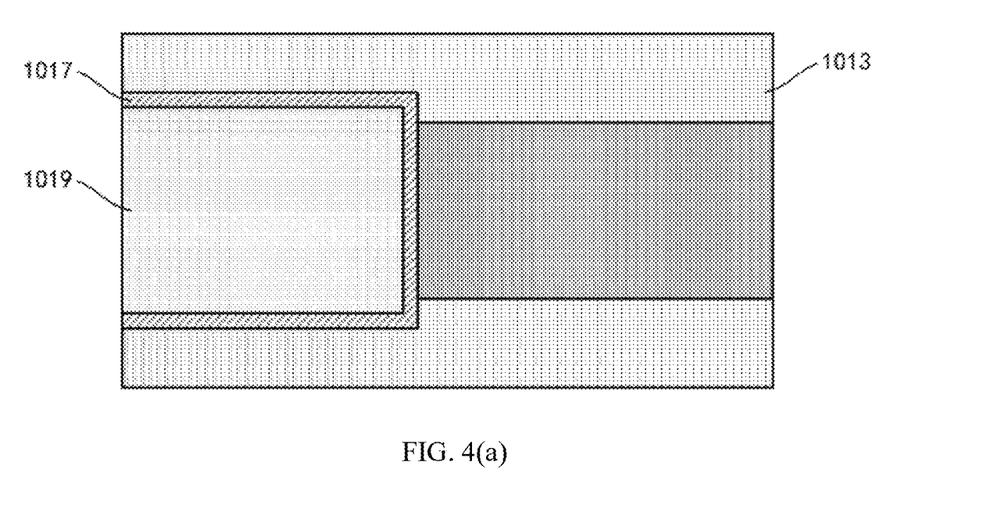
Figure 4B:
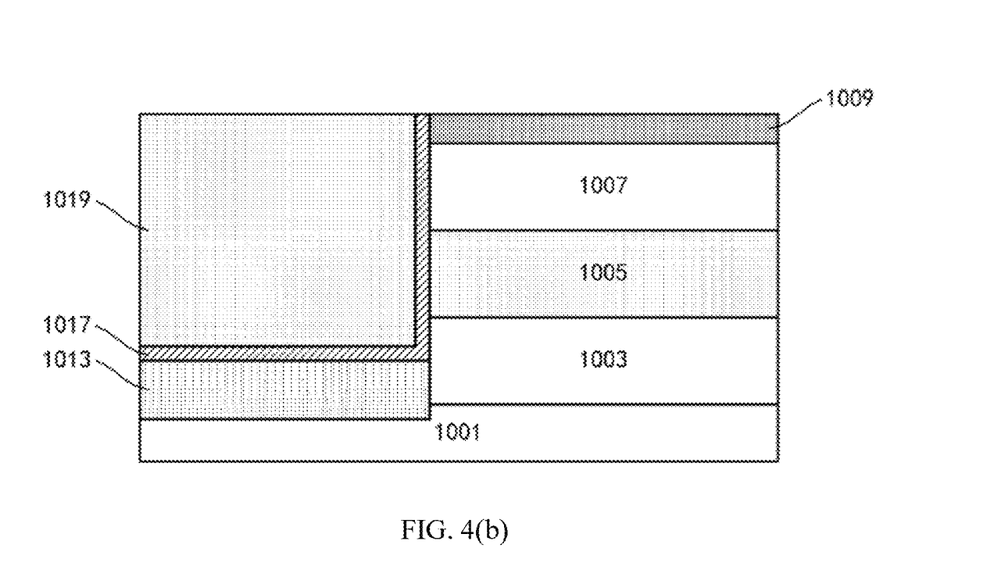

As shown in FIG. 4(*a*) and FIG. 4(*b*), a storage function layer 1017 and a gate conductor layer 1019 may be sequentially formed on the isolation layer 1013 by, for example, a deposition. The storage function layer 1017 may be formed in a substantially conformal manner, and the gate conductor layer 1019 may fill a gap left after the storage function layer 1017 is formed in the space. A planarization process such as CMP may be performed on the formed gate conductor layer 1019 and storage function layer 1017 (the planarization process may stop at, for example, the hard mask layer 1009), so that the gate conductor layer 1019 and the storage function layer 1017 may be left in the space described above, and the gate stack may be formed.

For example, the storage function layer 1017 may include a stack of a first dielectric layer, a charge trap layer and a second dielectric layer. The first dielectric layer and the second dielectric layer may include, for example, an oxide with a thickness in a range of about 1 nm to 10 nm, and the charge trap layer may include, for example, a nitride with a thickness in a range of about 2 nm to 15 nm. Alternatively, the storage function layer 1017 may include a stack of a dielectric layer and a ferroelectric material layer. The dielectric layer may include, for example, an oxide with a thickness in a range of about 1 nm to 10 nm, and the ferroelectric material layer may include, for example, HfZrO with a thickness in a range of about 2 nm to 15 nm. The gate conductor layer 1019 may include, for example, (doped) polysilicon or a metal gate material.

According to the embodiments, the storage function layer 1017 may extend from a bottom surface of the gate conductor layer 1019 onto a sidewall of the gate conductor layer 1019, and may be located between the sidewall of the gate conductor layer 1019 and the isolation layer 1013.

As shown in FIG. 4(*b*), the storage device according to the embodiment may include a stack layer of the first source/drain layer 1003, the channel layer 1005, and the second source/drain layer 1007. A gate stack (1017/1019) is located on a side of the stack layer, and is opposite to the stack layer, for example, opposite to the channel layer 1005 in the stack layer. The channel region formed in the channel layer 1005 may connect the source/drain regions formed in the first source/drain layer 1003 and the second source/drain layer 1007 at opposite ends, and the channel region may be controlled by the gate stack.

The gate stack, for example, the storage function layer 1017 in the gate stack, may extend along a sidewall of the channel layer 1005 and further extend (in a plane where the sidewall of the channel layer 1005 is located) onto the sidewall of the first source/drain layer 1003 and the sidewall of the second source/drain layer 1007. The gate stack may overlap the channel layer 1005 in the entire thickness of the channel layer 1005 in the vertical direction, so that a gate length of the device may be determined by the thickness of the channel layer 1005. In the example, a sidewall of the gate stack on a side of the gate stack facing the active region is substantially, over an entire vertical height, located in a plane where a sidewall of the active region on the side is located.

Figure 5:
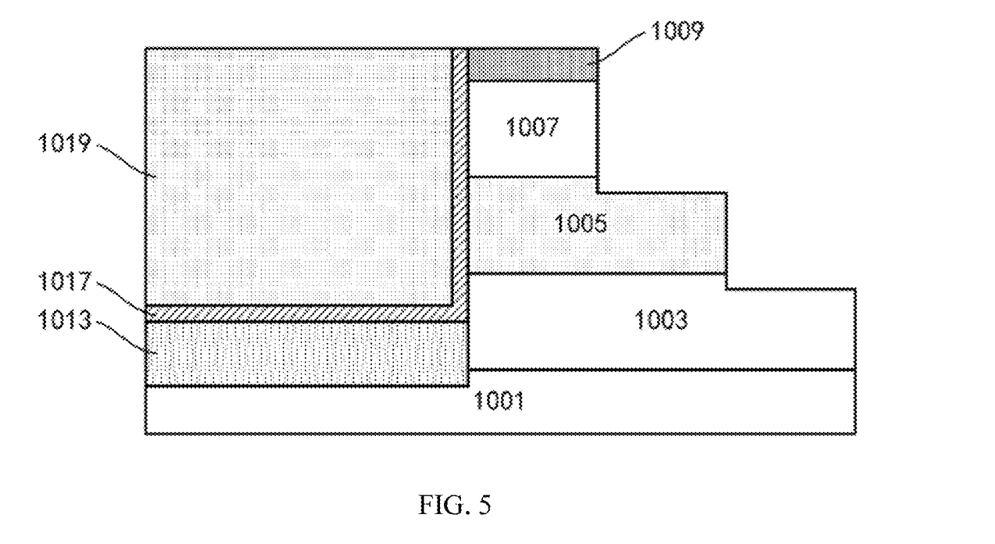

Next, a shape of the first source/drain layer 1003, a shape of the channel layer 1005, and a shape of the second source/drain layer 1007 may be adjusted to facilitate a subsequent interconnection fabrication. For example, as shown in FIG. 5, a step structure may be formed in the active region, in particular on a side of the active region away from the gate stack, by etching such as RIE, so as to define a landing pad of a contact portion to be formed later. Various manners in the art may be used to form such a stepped landing pad, which will not be described in detail here.

Figure 6:
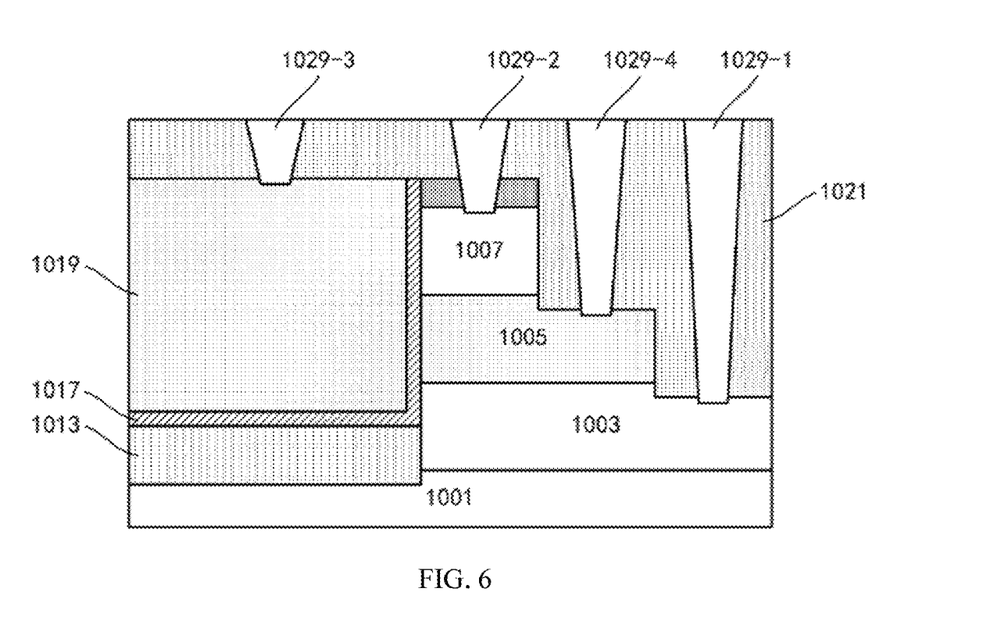

Then, as shown in FIG. 6, an interlayer dielectric layer 1021 may be formed on the substrate. For example, an oxide may be deposited and a planarization such as CMP may be performed on the oxide to form the interlayer dielectric layer 1021. A contact portion 1029-1 to the source/drain region formed in the first source/drain layer 1003, a contact portion 1029-2 to the source/drain region formed in the second source/drain layer 1007, and a contact portion 1029-3 to the gate conductor layer 1019 may be formed in the interlayer dielectric layer 1021 (and the isolation layer 1013). A bulk contact portion 1029-4 to the channel layer 1005 may also be formed. A bulk bias may be applied through the bulk contact portion 1029-4, and thus a threshold voltage of the device, for example, may be controlled. These contact portions may be formed by etching holes in the interlayer dielectric layer 1021 (and the isolation layer 1013) and filling the holes with a conductive material such as a metal.

Figure 7A:
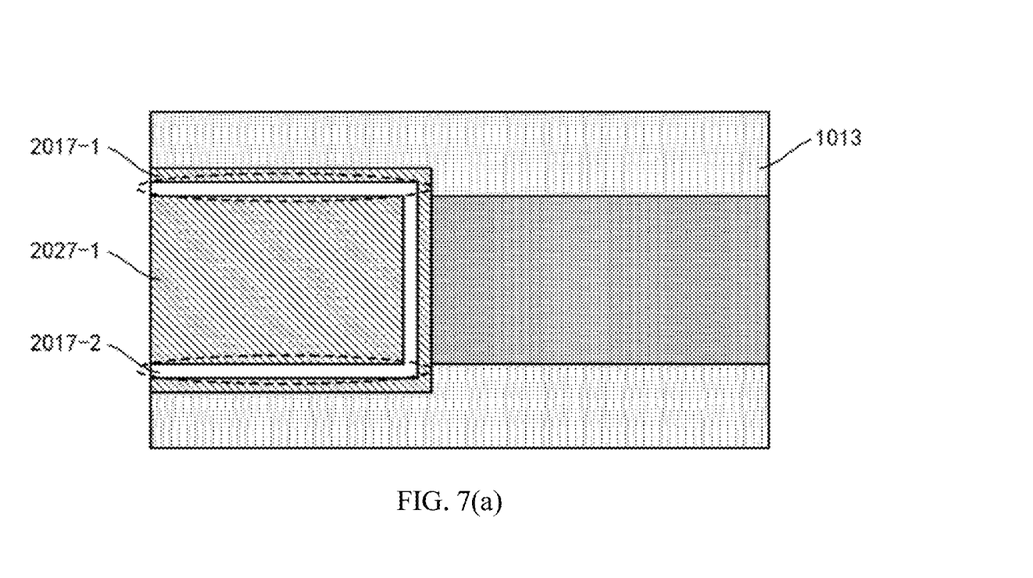
Figure 7B:
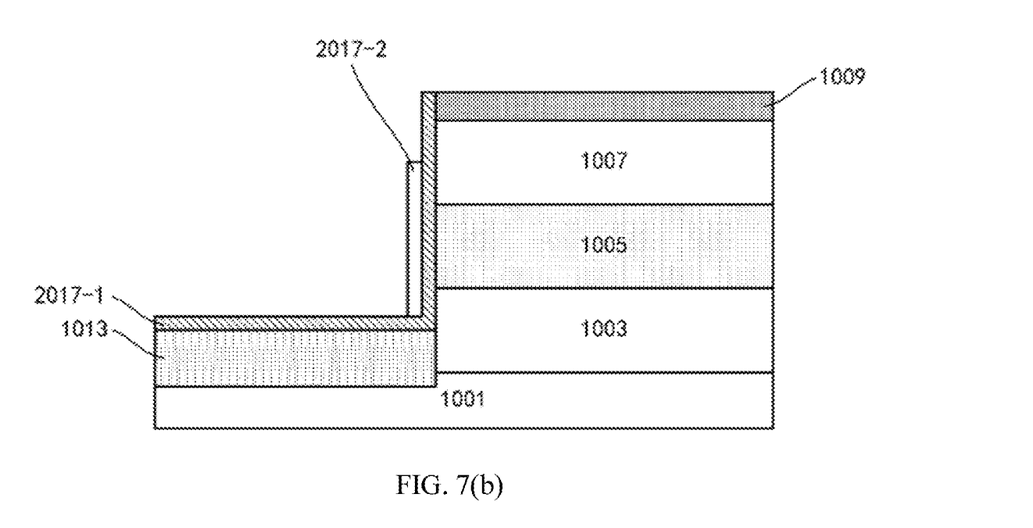
Figure 8:
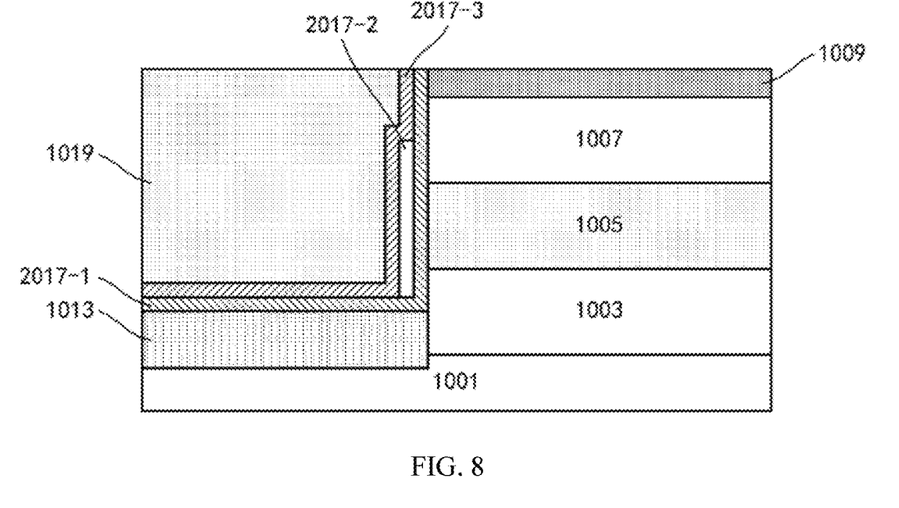

FIG. 7(*a*) to FIG. 8 show schematic diagrams of some stages in a process of manufacturing a storage device according to another embodiment of the present disclosure. Hereinafter, a difference between the embodiment and the above-described embodiments will be mainly described, and the rest of the process may be referred to the description in the embodiments described above. In the embodiment, the storage structure is formed in a form of a floating gate.

After forming the isolation layer 1013 and defining the formation space for the gate stack in the isolation layer 1013 as described above in combination with FIG. 1(*a*) to FIG. 3(*b*), a first dielectric layer 2017-1 may be formed, for example, by a deposition, and a floating gate layer 2017-2 may be formed on the first dielectric layer 2017-1, as shown in FIG. 7(*a*) and FIG. 7(*b*). The first dielectric layer 2017-1 may be formed in a substantially conformal manner, and may include, for example, an oxide with a thickness in a range of about 1 nm to 10 nm. The floating gate layer 2017-2 may include, for example, (doped) poly-Si or a metal gate material with a thickness in a range of about 1 nm to 15 nm. In order to reduce a parasitic capacitance, the floating gate layer 2017-2 may be formed in a spacer form. For example, the floating gate layer 2017-2 in the spacer form may be obtained by substantially conformally forming a thin film through depositing such as Chemical Vapor Deposition (CVD) or Atomic Layer Deposition (ALD) and then performing RIE on the thin film in a direction substantially perpendicular to the substrate surface. It needs to be ensured that the floating gate layer 2017-2 may overlap at least the sidewall of the channel layer 1005 so that a charge stored therein may better affect the channel and thus control the threshold voltage. Therefore, the floating gate layer 2017-2 needs to extend beyond the sidewall of the channel layer 1005 in the vertical direction. That is, a top surface of the floating gate layer 2017-2 is located not lower than, preferably higher than a top surface of the channel layer 1005 (or a bottom surface of the second source/drain layer 1007), and a bottom surface of the floating gate layer 2017-2 is located not higher than, preferably lower than a bottom surface of the channel layer 1005 (or the top surface of the first source/drain layer 1003). A photoresist may be used in combination when forming the floating gate layer 2017-2, so as to at least partially remove a portion of the floating gate layer 2017-2 not facing the channel layer 1005, such as a portion shown by dotted circles in FIG. 7(*a*), so that the parasitic capacitance may be reduced.

It should be noted that for convenience of illustration only, a portion of the first dielectric layer 2017-1 extending on a top surface of the hard mask layer 1009 is not shown in FIG. 7(*a*) and FIG. 7(*b*), and the portion may be removed in a subsequent planarization process of forming the gate conductor layer.

Then, as shown in FIG. 8, a second dielectric layer 2017-3 may be further formed. The second dielectric layer 2017-3 may be formed in a substantially conformal manner, and may include, for example, an oxide with a thickness in a range of about 1 nm to 10 nm. The first dielectric layer 2017-1 and the second dielectric layer 2017-3 may enclose the floating gate layer 2017-2, so as to electrically float the floating gate layer 2017-2. A stack of the first dielectric layer 2017-1, the floating gate layer 2017-2 and the second dielectric layer 2017-3 forms a storage function layer in the embodiment. As in the embodiments described above, the gate conductor layer 1019 may be formed on the storage function layer. Then, the subsequent processes may be performed as in the embodiments described above.

Figure 9:
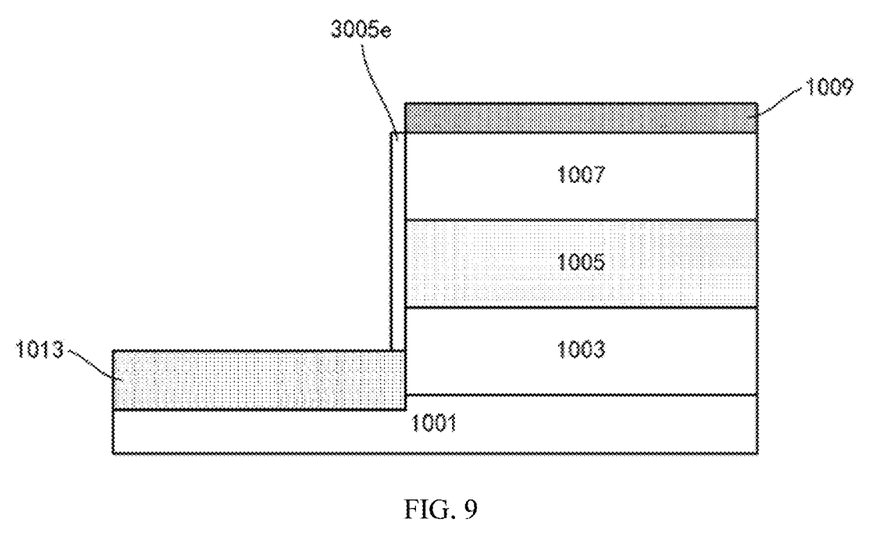
FIG. 9 shows a schematic diagram of a stage in a process of manufacturing a storage device according to another embodiment of the present disclosure.

FIG. 9 shows a schematic diagram of a stage in a process of manufacturing a storage device according to another embodiment of the present disclosure. Hereinafter, a difference between the embodiment and the above-described embodiments will be mainly described, and the rest of the process may be referred to the description in the above-described embodiments.

After forming the isolation layer 1013 and defining the formation space for the gate stack in the isolation layer 1013 as described above in combination with FIG. 1(*a*) to FIG. 3(*b*), as shown in FIG. 9, a semiconductor layer 3005*e* may be formed on an exposed surface of the active region by, for example, a selective epitaxial growth. For example, the semiconductor layer 3005*e* may include Si with a thickness in a range of about 3 nm to 20 nm. A material and thickness of the semiconductor layer 3005*e* may be selected to improve a device performance. For example, the semiconductor layer 3005*e* may include a material different from that of the first source/drain layer 1003, that of the channel layer 1005, and that of the second source/drain layer 1007 (all of which are Si in the example), such as Ge, a Group IV-IV compound semiconductor such as SiGe, a Group III-V compound semiconductor, or the like, so as to improve carrier mobility or reduce leakage current.

According to another embodiment, an SSRW may also be formed. For example, an annealing process may be performed to diffuse the dopant in the first source/drain layer 1003, the dopant in the channel layer 1005, and the dopant in the second source/drain layer 1007 into the semiconductor layer 3005*e* adjacent thereto, so as to form a doping distribution in the semiconductor layer 3005*e*. As the semiconductor layer 3005*e* is thin, the doping distribution in the semiconductor layer 3005*e* may be mainly determined by a lateral diffusion from the first source/drain layer 1003, the channel layer 1005 and the second source/drain layer 1007, and a diffusion in the vertical direction may not be considered or may be ignored. Therefore, a portion of the semiconductor layer 3005*e* corresponding in height to the first source/drain layer 1003 may have a doping characteristic determined by the dopant from the first source/drain layer 1003 (and a source/drain region may be defined in the portion); a portion of the semiconductor layer 3005*e* corresponding in height to the channel layer 1005 may have a doping characteristic determined by the dopant from the channel layer 1005 (and a channel region may be defined in the portion); a portion of the semiconductor layer 3005*e* corresponding in height to the second source/drain layer 1007 may have a doping characteristic determined by the dopant from the second source/drain layer 1007 (and a source/drain region may be defined in the portion).

A processing condition of the annealing process, such as an annealing time or the like, may be controlled so that in a portion of the semiconductor layer 3005*e* adjacent to the channel layer 1005 (i.e., the channel region described above), a dopant concentration at a sidewall (and the vicinity of the sidewall) of the semiconductor layer 3005*e* away from the channel layer 1005 in the lateral direction is lower than a dopant concentration at a sidewall (and the vicinity of the sidewall) of the semiconductor layer 3005*e* close to the channel layer 1005. In this way, the SSRW may be formed, and a short channel effect may be well controlled.

Next, a subsequent process may be performed as in the embodiments described above. For example, a storage function layer including a floating gate, a charge trap layer, a ferroelectric material, or the like may be formed, and a gate conductor layer may be formed.

Figure 10:
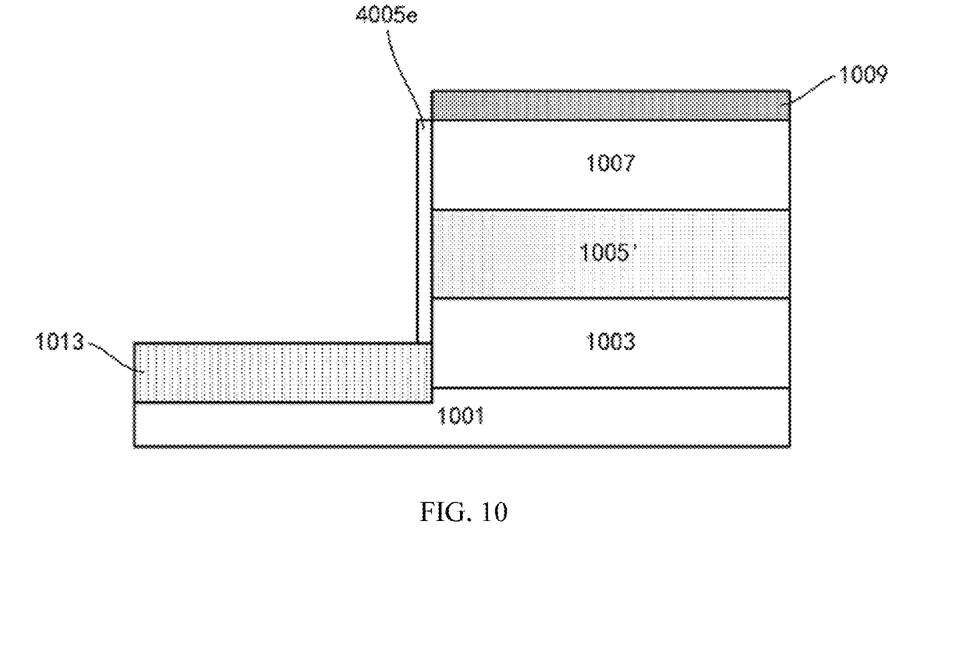
Figure 11:
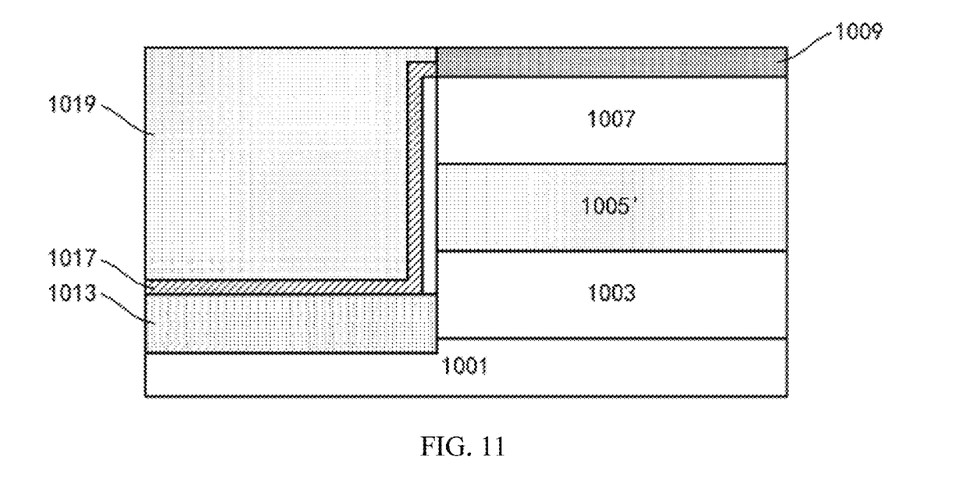
Figure 12:
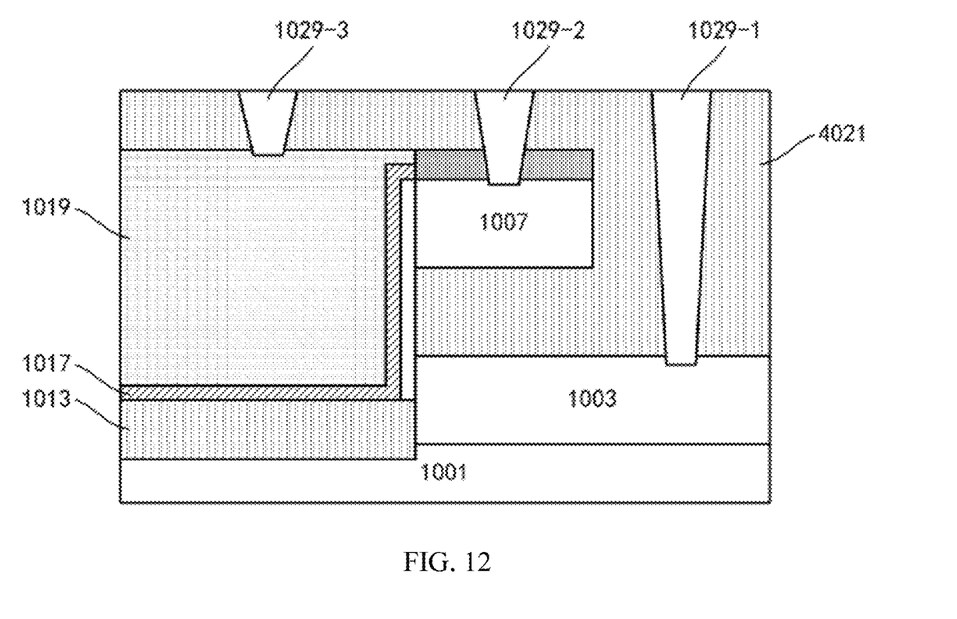

FIG. 10 to FIG. 12 show schematic diagrams of some stages in a process of manufacturing a storage device according to another embodiment of the present disclosure. Hereinafter, a difference between the embodiment and the above-described embodiments will be mainly described, and the rest of the process may be referred to the description in the above-described embodiments.

As described above in combination with FIG. 1(*a*) and FIG. 1(*b*), the first source/drain layer 1003, a channel layer 1005', and the second source/drain layer 1007 may be formed. In the embodiment, the channel layer 1005' may include a material having an etching selectivity with respect to the first source/drain layer 1003 and the second source/drain layer 1007, such as SiGe. The channel layer 1005' may be then removed and thus may be referred to as a sacrificial layer. Then, as described above in combination with FIG. 1(*a*) to FIG. 3(*b*), the isolation layer 1013 is formed and the formation space for the gate stack is defined in the isolation layer 1013. As shown in FIG. 10, a semiconductor layer 4005*e* may be formed on an exposed surface of the active region by, for example, a selective epitaxial growth. In this regard, further reference may be made to the description of the semiconductor layer 3005*e* in combination with FIG. 9. In the example, the semiconductor layer 4005*e* may include a material having etching selectivity with respect to the sacrificial layer 1005', such as Si.

Next, as shown in FIG. 11, as in the embodiments described above, a storage function layer 1017 and a gate conductor layer 1019 may be formed. As described above, the storage function layer 1017 may include a floating gate, a charge trap layer, a ferroelectric material, or the like.

Then, as shown in FIG. 12, the sacrificial layer 1005' may be exposed by selectively etching the hard mask layer 1009 and the second source/drain layer 1007. The sacrificial layer 1005' may be removed by the selective etching. As described above in combination with FIG. 9, a dopant in the first source/drain layer 1003 and a dopant in the second source/drain layer 1007 may be diffused into the semiconductor layer 4005*e* adjacent thereto by the annealing process. The annealing process may be performed after the removal of the sacrificial layer 1005', or may be performed before the removal of the sacrificial layer 1005' (in this case, a dopant in the sacrificial layer 1005' may also be diffused into a portion of the semiconductor layer 4005*e* adjacent to the sacrificial layer 1005', and an SSRW may be formed). After that, as described above in combination with FIG. 6, an interlayer dielectric layer 4021 may be formed, and contact portions 1029-1 to 1029-3 may be formed. The interlayer dielectric layer 4021 may fill a gap formed due to the removal of the sacrificial layer 1005'. In addition, in the example, the bulk contact portion 1029-4 may not be provided.

In the embodiment, the channel region may be formed in the thin semiconductor layer 4005e. The semiconductor layer 4005e may be in a form of a nanosheet or nanowire, and the device may be a nanosheet or nanowire device, so that the short channel effect may be controlled well and a power consumption may be reduced.

According to embodiments of the present disclosure, a channel dimension or a gate length is defined by the semiconductor layer between the first source/drain layer and the second source/drain layer. The semiconductor layer may be formed, for example, by an epitaxial growth so that a thickness of the semiconductor layer may be well controlled. The semiconductor layer may be used as a channel layer, or an additional semiconductor layer may be grown on the semiconductor layer (and the first source/drain layer and the second source/drain layer) to serve as the channel layer. Therefore, the channel dimension or the gate length may be well controlled.

The storage device according to the embodiments of the present disclosure may be applied to various electronic apparatuses. For example, the storage device may store various programs, applications, and data required for an operation of the electronic apparatus. The electronic apparatus may further include a processor cooperating with the storage device. For example, the processor may operate the electronic apparatus by executing a program stored in the storage device. The electronic apparatus may include, for example, a smart phone, a personal computer (PC), a tablet computer, an artificial intelligence device, a wearable device, a portable power source, and so on.

In the above description, the technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A vertical storage device, comprising:
    a first source/drain layer located at a first height with respect to a substrate and a second source/drain layer located at a second height different from the first height;
    a channel layer connecting the first source/drain layer and the second source/drain layer; and
    a gate stack comprising a storage function layer, the storage function layer extending on a sidewall of the channel layer and extending in-plane from the sidewall of the channel layer onto a sidewall of the first source/drain layer and a sidewall of the second source/drain layer.

2. The vertical storage device according to claim 1, wherein a substantially entire vertical sidewall of the storage function layer facing the first source/drain layer, the channel layer and the second source/drain layer is located substantially in a plane.

3. The vertical storage device according to claim 1, wherein the channel layer comprises a single-crystal semiconductor material.

4. The vertical storage device according to claim 1, wherein the gate stack is only arranged on a side of the first source/drain layer, the channel layer and the second source/drain layer.

5. The vertical storage device according to claim 1, wherein the first source/drain layer, the channel layer, and the second source/drain layer are sequentially stacked on the substrate.

6. The vertical storage device according to claim 5, wherein the sidewall of the first source/drain layer, the sidewall of the channel layer, and the sidewall of the second source/drain layer are substantially coplanar, and the storage function layer extends along the sidewall of the first source/drain layer, the sidewall of the channel layer, and the sidewall of the second source/drain layer.

7. The vertical storage device according to claim 5, wherein the first source/drain layer, the channel layer, and the second source/drain layer comprise the same semiconductor material and have a doping concentration interface therebetween.

8. The vertical storage device according to claim 1, wherein the channel layer comprises a nanosheet or nanowire extending from the sidewall of the first source/drain layer to the sidewall of the second source/drain layer.

9. The vertical storage device according to claim 8, further comprising:
    a semiconductor layer arranged between the first source/drain layer and the second source/drain layer in a vertical direction, wherein the channel layer is an epitaxial layer on the sidewall of the first source/drain layer, a sidewall of the semiconductor layer, and the sidewall of the second source/drain layer.

10. The vertical storage device according to claim 9, wherein the first source/drain layer, the semiconductor layer, and the second source/drain layer comprise the same semiconductor material and have a doping concentration interface therebetween.

11. The vertical storage device according to claim 8, wherein a dielectric layer is arranged between the first source/drain layer and the second source/drain layer.

12. The vertical storage device according to claim 11, wherein the channel layer is an epitaxial layer on the sidewall of the first source/drain layer and the sidewall of the second source/drain layer.

13. The vertical storage device according to claim 8, wherein the channel layer comprises a semiconductor material different from that of the first source/drain layer and that of the second source/drain layer.

14. The vertical storage device according to claim 8, wherein a portion of the nanosheet or nanowire at a height between the first source/drain layer and the second source/drain layer has a doping concentration on a side close to the gate stack lower than that on a side away from the gate stack.

15. The vertical storage device according to claim 8, wherein the nanosheet or nanowire extends substantially in a plane, and the storage function layer extends along the nanosheet or nanowire.

16. The vertical storage device according to claim 1, wherein the storage function layer comprises at least one of a charge trap material, a floating gate, or a ferroelectric material.

17. The vertical storage device according to claim 16, wherein the floating gate is formed in a spacer form, a bottom surface of the floating gate is lower than a top surface of the first source/drain layer, and a top surface of the floating gate is higher than a bottom surface of the second source/drain layer.

18. The vertical storage device according to claim 17, wherein the floating gate is located between a first dielectric layer and a second dielectric layer, the floating gate has such a shape that the floating gate does not exist between the first dielectric layer and the second dielectric layer at at least a portion of a sidewall of the gate stack not facing the channel layer.

19. The vertical storage device according to claim 1, further comprising:
an isolation layer arranged on the substrate, wherein the gate stack comprises the storage function layer and a gate conductor layer, and the storage function layer comprises a portion located between at least a portion of a sidewall of the gate conductor layer and the isolation layer.

20. The method according to claim 1, wherein the forming a gate stack comprises:
forming the storage function layer and a gate conductor layer sequentially, wherein the storage function layer comprises at least one of a charge trap material, a floating gate, or a ferroelectric material.

21. The method according to claim 20, wherein the forming the storage function layer comprises:
forming a first dielectric layer in a substantially conformal manner;
forming a floating gate in a spacer form on a vertical sidewall of the first dielectric layer; and
forming a second dielectric layer in a substantially conformal manner.

22. The method according to claim 21, further comprising:
at least partially removing a portion of the floating gate on a vertical sidewall of the first dielectric layer not facing the stack layer.

23. An electronic apparatus, comprising the vertical storage device according to claim 1.

24. The electronic apparatus according to claim 23, wherein the electronic apparatus comprises a smart phone, a personal computer, a tablet computer, an artificial intelligence device, a wearable device, or a portable power source.

25. A method of manufacturing a vertical storage device, comprising:
providing a stack layer of a first source/drain layer, a semiconductor layer and a second source/drain layer on a substrate;
forming an isolation layer surrounding a sidewall of the stack layer;
forming a space for a gate stack in the isolation layer, wherein a portion of a sidewall of the stack layer in a circumferential direction is exposed in the space, and a remaining portion of the sidewall of the stack layer in the circumferential direction is covered by the isolation layer; and
forming a gate stack comprising a storage function layer in the space, wherein the gate stack extends on the portion of the sidewall of the stack layer.

26. The method according to claim 25, wherein the stack layer is provided by an epitaxial growth.

27. The method according to claim 26, wherein the first source/drain layer and the second source/drain layer are doped in situ while being grown.

28. The method according to claim 27, wherein the semiconductor layer is doped in situ while being grown.

29. The method according to claim 25, further comprising:
forming a channel layer on the portion of the sidewall of the stack layer by a selective epitaxial growth, wherein the gate stack extends on the channel layer.

30. The method according to claim 29, further comprising:
removing the semiconductor layer by a selective etching.

31. The method according to claim 29, wherein the first source/drain layer and the second source/drain layer comprise a dopant.

32. The method according to claim 31, further comprising:
performing an annealing process so that the dopant in the first source/drain layer and in the second source/drain layer is diffused into the channel layer.

33. The method according to claim 32, wherein the semiconductor layer comprises a dopant, and the dopant in the semiconductor layer is diffused into the channel layer in the annealing process.

34. The method according to claim 33, wherein a portion of the channel layer corresponding in height to the semiconductor layer has a doping concentration on a side close to the gate stack lower than that on a side away from the gate stack.

35. The method according to claim 29, further comprising:
selecting a material of the channel layer different from a material of the semiconductor layer.

36. The method according to claim 25, wherein the portion of the sidewall extends substantially in a plane.

37. The method according to claim 25, wherein the portion of the sidewall comprises, in a vertical direction, at least an entire height of a sidewall of the semiconductor layer.

* * * * *